United States Patent
Enichlmair

(10) Patent No.: US 8,008,664 B2
(45) Date of Patent: Aug. 30, 2011

(54) COMPONENT COMPRISING A THIN-FILM TRANSISTOR AND CMOS-TRANSISTORS AND METHODS FOR PRODUCTION

(75) Inventor: Hubert Enichlmair, Graz (AT)

(73) Assignee: austriamicrosystms AG, Unterpremstätten (AT)

( * ) Notice: Subject to any disclaimer, the term of this patent is extended or adjusted under 35 U.S.C. 154(b) by 183 days.

(21) Appl. No.: 12/375,529

(22) PCT Filed: Jul. 25, 2007

(86) PCT No.: PCT/EP2007/057675
§ 371 (c)(1),
(2), (4) Date: Aug. 26, 2009

(87) PCT Pub. No.: WO2008/012332
PCT Pub. Date: Jan. 31, 2008

(65) Prior Publication Data
US 2010/0032675 A1 Feb. 11, 2010

(30) Foreign Application Priority Data
Jul. 28, 2006 (DE) .......................... 10 2006 035 073

(51) Int. Cl.
H01L 21/8238 (2006.01)
(52) U.S. Cl. .................. 257/66; 438/154; 257/E27.081; 257/E21.632
(58) Field of Classification Search .................... 257/66, 257/350, E21.614
See application file for complete search history.

(56) References Cited

U.S. PATENT DOCUMENTS

| | | | |
|---|---|---|---|
| 4,777,147 A | 10/1988 | Scott et al. |
| 5,159,416 A | 10/1992 | Kudoh |
| 5,202,849 A | 4/1993 | Nozaki |
| 5,298,782 A | 3/1994 | Sundaresan |

(Continued)

FOREIGN PATENT DOCUMENTS

DE 195 31 629 1/1997

(Continued)

OTHER PUBLICATIONS

D.S. Satwinder et al., "Characteristics and Three-Dimensional Integration of MOSFET's in Small-Grain LPCVD Polycrystalline Silicon", IEEE Transactions on Electron Devices, vol. ED-32, No. 2. pp. 258-281.

(Continued)

*Primary Examiner* — Zandra Smith
*Assistant Examiner* — Paul E Patton
(74) *Attorney, Agent, or Firm* — Cozen O'Connor

(57) ABSTRACT

An electrical component, in the crystalline semiconductor body of which several CMOS transistors in high-voltage or low-voltage technology are formed. The individual CMOS transistors are separated from one another by insulation regions. On one insulation region, a thin-film transistor is formed, having a gate that is realized simultaneously with the gates of the CMOS transistors from the same polysilicon layer. The gate oxide of the thin-film transistor, just like a second polysilicon layer for source drain and body of the thin-film transistor, can be produced together with the structural elements already present in the CMOS process.

15 Claims, 2 Drawing Sheets

U.S. PATENT DOCUMENTS

| | | | |
|---|---|---|---|
| 5,393,992 A | 2/1995 | Suzuki | |
| 5,453,952 A | 9/1995 | Okudaira et al. | |
| 5,970,338 A * | 10/1999 | Tempel | 438/241 |
| 6,025,219 A | 2/2000 | Kinoshita | |
| 6,271,897 B1 | 8/2001 | Ichikawa et al. | |

FOREIGN PATENT DOCUMENTS

| | | |
|---|---|---|
| DE | 197 32 237 | 7/1998 |
| EP | 0 152 625 | 8/1985 |

OTHER PUBLICATIONS

S. Shunji et al., "Laser-Recrystallized Polycrystalline-Silicon Thin-Film Transistors with Low Leakage Current and High Switching Ratio", IEEE Electron Device Letters, vol. EDL-8, No. 9, pp. 425-427, Sep. 1987.

* cited by examiner

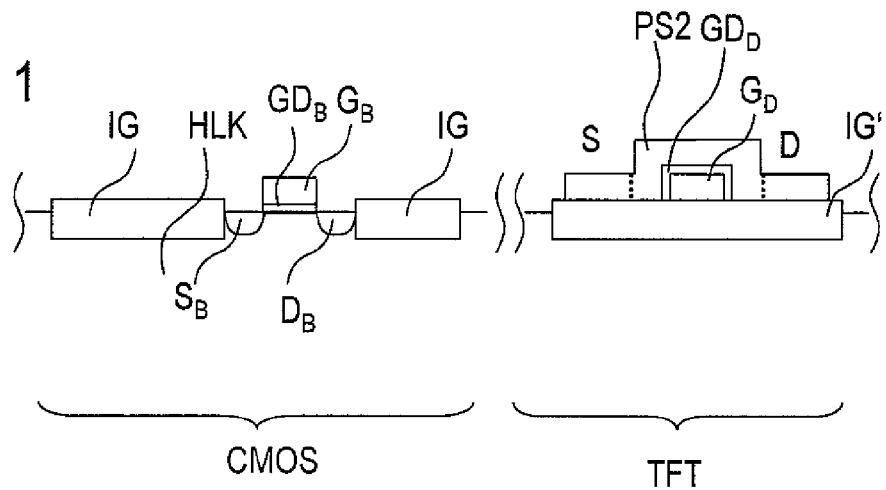
Fig 1
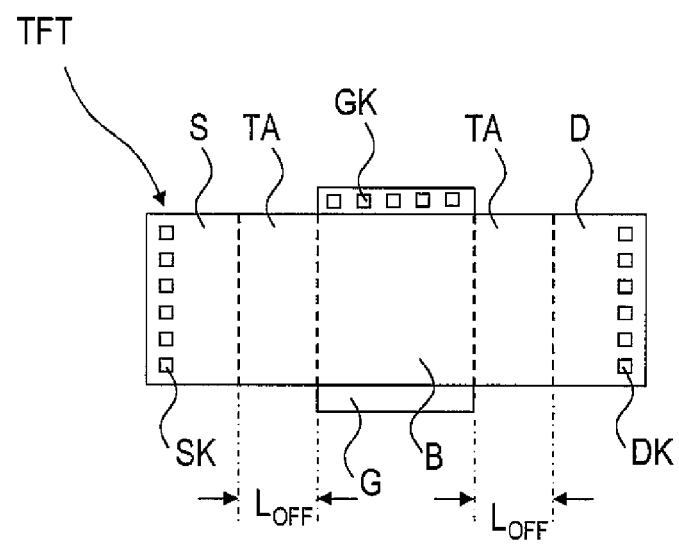
Fig 2
Fig 4
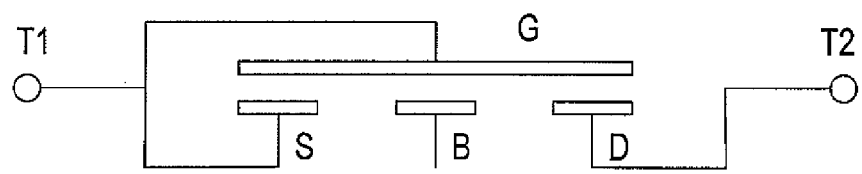

COMPONENT COMPRISING A THIN-FILM TRANSISTOR AND CMOS-TRANSISTORS AND METHODS FOR PRODUCTION

RELATED APPLICATIONS

This is a U.S. national stage under 35 USC §371 of application No. PCT/EP2007/057675, filed on Jul. 25, 2007.

This application claims the priority of German Application No.: 10 2006 035 073.1 filed Jul. 28, 2006, the disclosure content of which is hereby incorporated by reference.

BACKGROUND OF THE INVENTION

The invention relates to a component in which thin-film transistors and CMOS transistors are integrated. Components of this type are used, for instance, as semiconductor memories, wherein the thin-film transistor serves as the switching transistor for a memory cell comprising CMOS transistors.

Such a memory is known, for instance, from U.S. Pat. No. 5,298,782 A.

SUMMARY OF THE INVENTION

An object of the present invention is to provide a semiconductor component with CMOS transistors, in which a thin-film transistor is integrated.

An electrical component comprises a crystalline semiconductor body with CMOS transistors formed therein. For electrical separation, the CMOS transistors are surrounded with insulation regions, which are constructed as field oxide regions or as STI (Shallow Trench Isolation) regions. In at least one place, one of the insulation regions is increased in surface area sufficiently that space is created there for a thin-film transistor arranged directly on top of the insulation region. The gate of the CMOS transistors and the gate of the thin-film transistor are both structured from a common polysilicon layer and therefore have identical film thicknesses, identical crystal structures and identical doping.

The body of the thin-film transistor, as well as its source and drain, are then separated from the gate by a gate dielectric film, formed in an additional polysilicon layer above the gate of the thin-film transistor.

In the specified component, the thin-film transistor is completely insulated from the CMOS transistors. No leakage currents to the semiconductor body that forms the substrate of the CMOS transistors can occur. The thin-film transistor can therefore be operated with different operating and switching voltages, just like the CMOS transistors. The insulation is assured up to the breakdown voltage of the insulation region. An insulation region chosen to be appropriately thick can therefore serve to adjust a sufficiently high, or a desired, breakdown voltage between the thin-film transistor and the semiconductor body.

Breakdown voltages of ca. 20 V can be achieved for the thin-film transistor. Threshold voltages of ca. 2 V or more can be realized. The thin-film transistor can be connected to the CMOS transistors and can carry out a great diversity of tasks for the component. The thin-film transistor can be utilized as a high-speed switching transistor, as a variable resistance, as a diode or as a symmetrical transistor. The thin-film transistor has low parasitic capacitance and short minority charge carrier lifetime, which makes possible a fast switching process and thus a fast switching transistor.

In order to produce the component according to an embodiment of the invention, only one additional step (mask step) is required for the additional integration of the thin-film transistor into the manufacturing process of the CMOS transistor formed in the semiconductor body. The method starts with the production of the insulation regions by local thermal oxidation, or by producing a trench and filling it with a deposited dielectric, in particular, an oxide. The active regions are kept free from insulating regions, and the individual CMOS transistors are electrically isolated from one another by the insulation regions. At least in one area of the insulation regions, a sufficiently high surface above the insulation region is reserved, which is formed with a sufficiently large surface area to serve as a base for the at least one thin-film transistor.

In the same step in which the first polysilicon layer is deposited and structured on top of a gate dielectric arranged on the active region of the CMOS transistor to form the gate electrode, the gate electrode of the thin-film transistor is also structured out of the first polysilicon layer above the flat insulation region. The first polysilicon layer is referred to below as the poly-1 level. In one of the next steps of the method, a second polysilicon layer, which also serves for conventional CMOS transistors as the poly-2 level for structural elements of the CMOS transistors, is applied and structured. Above the gate electrode of the thin-film transistor, the body, source and drain of the thin-film transistor are structured from the poly-2 level.

Another gate dielectric is produced in the area of the thin-film transistor between the poly-1 level and the poly-2 level; in particular, an oxide is grown or deposited.

For the CMOS part of the component, the method for producing the component can comprise the production of a capacitor consisting of the poly-1 level as the first capacitor electrode, a dielectric and the poly-2 level as the second capacitor electrode. In this case, the dielectric for this "CMOS capacitor" can simultaneously serve as the gate dielectric for the thin-film transistor, so that no additional method step is necessary.

The first and second polysilicon layers can be deposited undoped; the first can be doped. Two different kinds of doping are necessary in the second polysilicon layer: first, a relatively strong doping for the conductive structural elements of the CMOS transistor, and second, a relatively weaker one for the body of the thin-film transistor.

Therefore, the second polysilicon layer is first implanted with a doping suitable for the body of the thin-film transistor, preferably a weak p-type doping with a doping level of $10^{16}$-$10^{17}$ cm$^{-3}$ by implanting a corresponding amount of doping material.

Then an absorber layer, preferably a resist layer, is applied and structured such that it covers the body region of the thin-film transistor, which is arranged directly above the corresponding gate electrode. In the subsequent doping of the other regions of the second polysilicon layer, the absorber layer prevents the doping of the body.

The production and structuring of the absorber layer represent an additional mask step, which expands the method according to the invention with respect to a conventional CMOS method. The additional method steps for completing the component are adapted by appropriate modification of conventional CMOS technology, and require no additional method step for the integration of the thin-film transistor into the production of the CMOS component.

In the next step, the source and drain for both component types are doped by introducing an appropriately high doping into the respective regions of the semiconductor body (for the CMOS transistors) or the corresponding regions of the second polysilicon layer (for the thin-film transistor). Doping type, doping method and doping level of the respective source and drain do not differ for the two transistor types, so that the method can be performed in one step by a doping or implantation mask with appropriately formed mask openings.

If a component according to the invention is produced with a thin-film transistor that has an n-doped gate and an $n^+$-doping for source and drain and a p-doping for the body, then this is an enhancement-type transistor. In the base state, in which no bias is applied to the gate of the thin-film transistor, such a transistor is in the off state. By applying a positive potential relative to the body to the gate electrode, an inversion channel can be produced by displacing the majority carriers there, so that the minority carriers, the electrons in this case, determine the conductivity of the channel.

The level of the current flowing through the channel is proportional to the applied gate voltage, so that the thin-film transistor according to the invention can be used as a variable resistor. It has been shown, however, that such a thin-film transistor has a relatively high leakage current.

It was found that the leakage current essentially depends on the field strength in the region between the inversion channel and the drain, since it is very high in that area. In one configuration of the invention, a respective transition region with a doping gradient was therefore created between the source/drain and the body of the thin-film transistor. This is accomplished in a simple manner by positioning the corresponding mask openings during the production of the source/drain doping such that a reserved region remaining undoped in this doping step is left between the source and drain, respectively, and the body. This initially undoped strip inside the second polysilicon layer can be made into a transition region by causing the high doping of the source/drain regions to diffuse into this initially undoped region in a later thermal step. This thermal step can be part of the CMOS process, so that no separate temperature treatment is necessary.

A transition area with a doping gradient ensures a uniform field distribution, which substantially reduces the leakage current of the thin-film transistor. A transition area on the order of 1 μm has proven advantageous.

The temperature budget that acts on the component with the remaining steps of the CMOS leads to an outward diffusion in the range of the order of magnitude, ca. 1 μm, of this reserve strip. As a function of the structure of the polysilicon layer, and of the selected channel width in particular, the width of the reserve strip can be appropriately adapted. A suitable gate length is, for instance, 10 μm and less.

The second polysilicon layer can serve in CMOS technology for producing component structures selected from resistors, capacitor electrodes, electrical supply lines and field plates. In the component, the second polysilicon layer is accordingly used for the production of at least one of these structures.

A component according to an embodiment of the invention with integrated thin-film transistor can also be produced with a $p^+$-doped source and drain. There as well, a thin-film transistor of the enhancement type, which is nonconductive without application of the voltage to the gate, is produced. Although the second polysilicon layer in the region of the thin-film transistor is always p or $p^+$ doped, a depletion zone arises because of the work function and the $n^+$-doped gate which, only with a negative gate voltage applied, leads to an enhancement of the majority charge carriers (holes) in the region of the channel and thus to conduction.

BRIEF DESCRIPTION OF THE DRAWINGS

The invention will be described in detail below with reference to embodiments and the associated figures. The figures serve only to illustrate the invention, and are therefore executed only schematically and not to scale.

FIG. 1 shows a component according to an embodiment of the invention in schematic cross section, FIG. 2 shows a thin-film transistor in a plan view, FIG. 4 shows a connection of the thin-film transistor as a blocking diode.

DETAILED DESCRIPTION OF THE DRAWINGS

FIG. 1 shows a possible configuration of a component according to an embodiment of the invention in a schematic cross section. In a common semiconductor body HLK, a silicon wafer or a wafer with an epitaxial layer for example, CMOS transistors are realized, of which a low-voltage MOS transistor is shown in the figure for the sake of example. The active regions of the CMOS transistors are separated from one another by insulating regions IG. The insulating regions can be embodied as field oxides or as STI (shallow trench isolation). In the vicinity of one of the CMOS transistors, or at a different point in the semiconductor body remote therefrom, another insulation region IG', which has a sufficient surface area to accommodate a thin-film transistor, is realized. The thin-film transistor area is labeled TFT in the figure.

The thin-film transistor TFT and the CMOS transistor have respective gates $G_D$, $G_B$, which are structured from the same (first) polysilicon layer in the same process step. The polysilicon layer is deposited to a thickness of, for example, 0.3 μm doped or undoped, and subsequently doped appropriately by, for example, implantation of phosphorus-containing ions or substances. In the region of the CMOS transistor, the first polysilicon layer for the gate $G_B$ is applied to a thin layer of a gate dielectric $GD_B$, on a deposited or thermally produced oxide layer, for example, while the gate $G_D$ of the thin-film transistor TFT can be situated directly on top of the insulating region IG'.

The thin-film transistor TFT further consists of a thin film of gate dielectric $GD_D$ and, above it, an additional (second) polysilicon layer PS2, which overlaps the gate $G_D$. The source S and the drain D are realized by an appropriately high doping of the $p^+$ or $n^+$ type on either side of the gate. In the remaining area, i.e., directly above the gate, the second polysilicon layer PS2 has a weaker body doping, a p-doping in the selected example.

The CMOS transistor is completed by highly doped regions for the source $S_B$ and the drain $D_B$ on either side of the gate $G_B$.

Figure 3A:
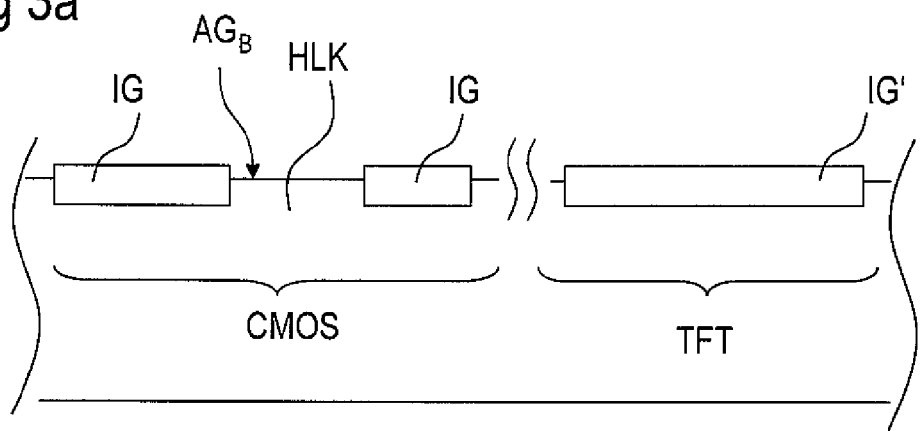
FIGS. 3a to 3d show various process stages in the production of the component.
Figure 3B:
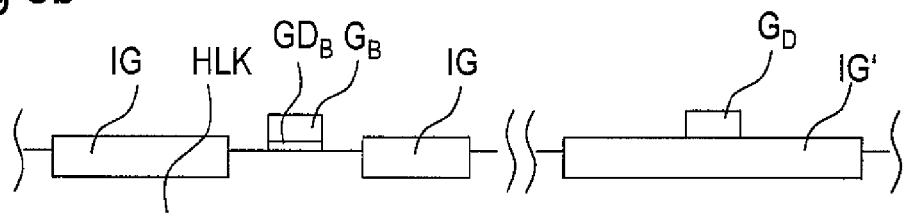
Figure 3C:
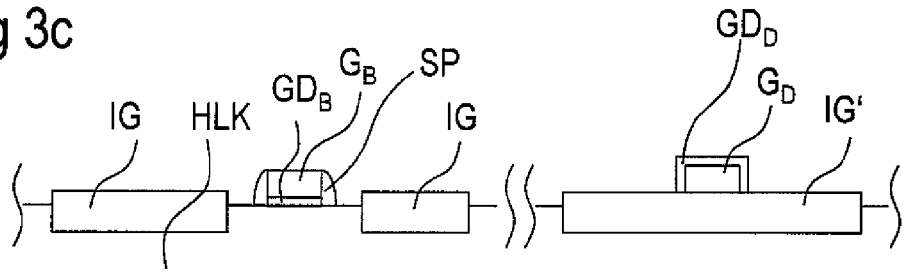

The most important steps in the production of the component according to an embodiment of the invention are represented and explained in FIGS. 3A to 3D on the basis of various characteristic process steps. In the region of the CMOS transistor, active regions $AG_B$ are defined and are free of insulating regions IG, which are realized as a field oxide or STI region. A larger-surface insulating region IG' is realized in the area of the thin-film transistor TFT. In the next step, a gate dielectric $GD_B$ for the CMOS transistor realized in the bulk material of the semiconductor body HLK is deposited over the entire surface. Then the first polysilicon layer is produced over a large area and with a thickness, 0.3 μm, for example, that is suitable for the gate electrodes, and is doped or undoped. Then there is a subsequent doping, for instance, a $p^+$ doping by implantation of phosphorus-containing ions or substances. It is also possible, however, to dope the gate electrodes $G_B G_D$ for the CMOS and the thin-film transistor differently. The two gate electrodes are structured from the first polysilicon layer in the next step. FIG. 3B shows the arrangement at this process stage.

In the next step, a spacer structure SP is realized in a known conventional manner around the gate electrode $G_B$ of the CMOS transistor. The same spacer technology can be used for the thin-film transistor, but it is not necessary. A gate dielectric $GD_D$ for the gate on the TFT side is produced in the next step. This dielectric, an oxide in particular, can again be deposited or thermally produced. In the case of a deposition of the gate dielectric, that can take place over the entire surface in order to serve two steps later as an etch-stop for the structuring of the second polysilicon layer.

The second polysilicon layer PS2 is deposited over the entire surface with a thickness of, for example, 0.1-0.3 μm. The initially undoped layer is subsequently provided in a first step with doping suitable as a body doping for the thin-film transistor TFT. In particular, a p-doping is imparted by means of implantation.

In the next step or one of the next steps, the source and drain regions for the two transistor types are defined in common by producing an implantation mask, for example, by structuring a resist film, and by applying a high doping for the source and drain regions by means of implantation wherein again an $n^+$-doping or a $p^+$-doping can be produced. The implantation is self-adjusting with respect to the gate electrode $GD_B$ in the CMOS transistor area. In the area of the thin-film transistor TFT, mask openings are created, whose respective edge facing the gate electrode $G_D$ does not directly adjoin the gate electrode, but is separated from the gate by d reserve strip TA.

FIG. 2 shows the finished thin-film transistor TFT in a plan view. The region TA eliminated from doping, which corresponds to the reserve strip of the implantation mask, is clearly recognizable. This has the effect that the source and the drain are each removed from the edge of the gate G by an offset of length $L_{OFF}$.

After implantation, the second polysilicon layer in the region of the thin-film transistor outside of source S and drain D has only body doping, for instance, the aforementioned p-type doping. The gate G and the second polysilicon layer PS2 are each structured in a strip shape in the area of the thin-film transistor TFT in such a manner that they cross one another. At one outer end of source S, drain D and gate G, respectively, these active regions of the transistors are electrically connected via contacts, in particular, via source contacts SK, drain contacts DK and gate contacts GK. They can be connected in a later step by structuring contact holes and filling these contact holes with conductive material, in particular, with tungsten.

Figure 3D:
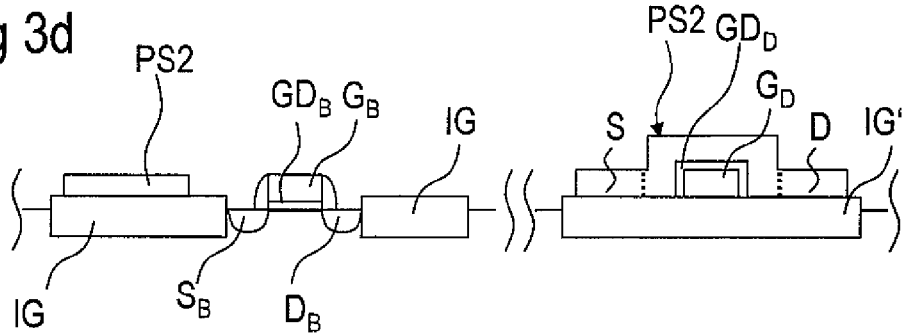

FIG. 3D shows the arrangement at this process stage in a schematic cross section. FIG. 3D shows an additional detail of the method according to an embodiment of the invention, in which the second polysilicon layer PS2 is used for producing not only the source, drain and body of the thin-film transistor but also the component structures in the area of the CMOS transistor, for instance, conductive connections which, for example, run directly over the insulating regions IG. In the area of the CMOS transistor, additional structures can be produced in intermediate layers under the second polysilicon layer.

Both transistors typically become fully functional in a number of thermal steps that can be carried out in various subsequent process stages. Therein the doping of the source and drain of the CMOS transistor is activated. The temperature budget that is expended in the area of the thin-film transistor leads to a diffusion of the doping substances from the source and drain in the direction of the body, with a region TA (see FIG. 2) being produced in the area of the reserve strip, in which a doping gradient is formed that produces a gradual transition between the high doping of the source and drain and the relatively weak body doping.

An advantageous body doping lies in the range from $10^{16}$ $cm^{-3}$-$10^{17}$ $cm^{-3}$. The doping material gradient in the transition area TA brings about a uniform field distribution, which avoids high field peaks between the gate and the source or drain. This has the effect that the thin-film transistor that is obtained has a lowered leakage current.

The leakage current can be adjusted to a desired value, and in particular reduced, by enlarging the offset length $L_{OFF}$, by means of the width of the transition region or the offset length with which the openings in the mask are offset from the gate during the doping of the source and drain of the thin-film transistor.

FIG. 4 shows a possible wiring of the thin-film transistor as a blocking diode. For that purpose, the source S and the gate G are placed at the same potential or are electro-conductively connected to one another. In the case of $n^+$-doped source and drain, this transistor blocks the flow of current if there is a positive potential at terminal T2, but 0 V or a negative potential is present at terminal T1. In case of a polarity reversal, i.e., in case of a positive potential at terminal T1, current can flow from T1 to T2. In this wiring, the thin-film transistor can thus fulfill a diode function, which allows the current to pass in only one direction.

With an opposite doping, i.e., if source S and drain D are $p^+$-doped, a blocking effect with the opposite polarity is achieved with otherwise identical wiring.

To improve the blocking effect, it is possible to connect several thin-film transistors in series according to the wiring shown in FIG. 4, i.e., to connect the terminal T2 of a first thin-film transistor to the terminal T1 of a second thin-film transistor.

With the wiring illustrated in FIG. 4, a floating body is obtained in all cases, the potential of which is essentially determined by the forward-biased semiconductor junction. In the forward direction, the gate electrode is at the same potential as the drain, with an inversion channel being formed. In the blocking case, gate, source and body are at nearly the same potential and thereby produce the blocking effect.

The invention is not limited to the embodiment examples illustrated in the figures. In particular, a component according to the invention can also comprise, alternatively or in addition to the illustrated low-voltage transistor, a high-voltage CMOS transistor, into the production of which the production of the thin-film transistor can be equally well integrated. The method according to the invention does not exclude additional method steps being performed before, between and after the above-mentioned method steps, in order to adapt the method in this specific case to the process steps for high-voltage CMOS technology.

In particular, a high-voltage CMOS transistor can comprise a drain-side drift region between the gate and the drain. An additional insulation region can run above the drift region, with the gate electrode of the CMOS transistor then being situated in part on this additional insulation region. The structure of the thin-film transistor is also presented only in principle in FIG. 1 and can differ therefrom in details. Nor is the structuring of the second polysilicon layer on the side of the thin-film transistor limited to the geometry presented in FIG. 2.

In all cases, however, it is possible with the invention to produce a CMOS transistor and a thin-film transistor in a joint process, only one additional step with respect to the known CMOS process being required for integration of the thin-film transistor. This facilitates the production of the component and leads to a fully insulated thin-film transistor that is almost completely decoupled from the substrate and the active component structures realized therein. The component can be produced in standardized CMOS technology without having to adapt its parameters, except for the mask structures. The thin-film transistor can be used as a high-speed switching transistor, wherein source/drain breakdown voltages of approximately 20 V can be achieved. In conjunction with the CMOS transistor, the thin-film transistor can serve as a fast switching transistor for a semiconductor memory element comprising the CMOS transistors.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor component comprising:
    a substrate that comprises a crystalline semiconductor body;
    several CMOS transistors formed in the semiconductor body;
    insulation regions formed between the CMOS transistors for mutual electrical isolation that comprise field oxide regions or STI regions;
    an additional insulation region that has a larger surface area than the other insulation regions;
    a thin-film transistor with a gate arranged on the additional insulation region;
    a first polysilicon layer; and
    a second polysilicon layer,
    wherein both a gate of a CMOS transistor and a gate of the thin-film transistor are formed in the first polysilicon layer and therefore have the same layer thickness and crystal structure,
    wherein the thin-film transistor has a source, a body and a drain that are formed in the second polysilicon layer, which also serves for structural elements of the CMOS transistors, and
    wherein the source and drain of the thin-film transistor are formed on either side of the gate in the second polysilicon layer by a $p^+$-type or $n^+$-type doping.

2. A method for manufacturing a component with CMOS transistors and at least one thin-film transistor, comprising the steps of:
    electrically isolating the active regions for the CMOS transistors from one another in a semiconductor body by insulation regions by producing field oxide regions or STI regions, wherein at least one insulation region is formed, as a base for the at least one thin-film transistor, with a larger surface area than is necessary for pure insulation between the CMOS transistors;
    producing, in the same common process, both the gate of the CMOS transistors above a layer of a gate dielectric and simultaneously the gate of the thin-film transistor on the flat insulation region by depositing and structuring a first polysilicon layer for a poly-1 level;
    applying a second polysilicon layer, which overlaps the gate of the thin-film transistor and is structured into source, drain and body of the thin-film transistor, wherein structural elements of the poly-2 level of the CMOS transistor are simultaneously produced; and
    forming a source and drain of the thin-film transistor on either side of the gate in the second polysilicon layer by a $p^+$-type or n+-type doping.

3. The method according to claim 2, in which the first polysilicon layer is $n^+$-doped after the deposition.

4. The method according to claim 2, in which a gate dielectric is produced above the gate of the thin-film transistor before the application of the second polysilicon layer.

5. The method according to claim 2, in which, from the layers for the first polysilicon layer, the gate dielectric and the second polysilicon layer, a capacitor using the two polysilicon layers as capacitor electrodes and the gate dielectric therebetween as the capacitor dielectric is produced at another point of the component.

6. The method according to claim 2, in which the second polysilicon layer is deposited undoped and in which a weak p-doping is subsequently produced therein.

7. The method according to claim 6, in which the weak p-doping is produced in the entire second polysilicon layer, the second polysilicon layer is finally highly doped to produce conductive structures in the designated areas of the CMOS transistors and said high doping is prevented in the area of the body by an absorber mask applied thereto.

8. The method according to claim 6, in which the weak p-doping in the body is produced with a doping level of $10^{16}$-$10^{17}$ cm$^{-3}$.

9. The method according to claim 2, in which, to produce the source and drain, both corresponding areas of the semiconductor body for the CMOS transistors and corresponding areas of the second polysilicon layer for the thin-film transistor are highly doped in a common step.

10. The method according to claim 9, in which a doping mask with mask openings for the source and drain is used for doping the source and drain of the thin-film transistor, wherein the gate and a reserve strip on either side of the gate are shielded from the doping.

11. The method according to claim 10, in which the high source and drain doping of the thin-film transistor is diffused in a thermal step into the area of the second polysilicon layer left undoped due to the reserve strip of the doping mask, and produces a doping gradient there.

12. The method according to claim 11, in which the doping gradient is produced by diffusion from the highly doped source and drain in a thermal step, with which the source and drain of the CMOS transistors are simultaneously activated.

13. The method according to claim 2, in which component structures of the CMOS transistors, selected from resistors, capacitor electrodes, electrical supply lines and field plates, are formed in the second polysilicon layer.

14. The method according to claim 3, in which the source and drain of the thin-film transistor are $p^+$-doped, wherein an enhancement-type transistor with an accumulation channel is obtained.

15. The method according to claim 3, in which the source and drain of the thin-film transistor are $n^+$-doped, wherein an enhancement-type transistor with an inversion channel is obtained.

* * * * *